United States Patent
Ouchida et al.

(10) Patent No.: US 6,525,264 B2
(45) Date of Patent: Feb. 25, 2003

(54) THIN-FILM SOLAR CELL MODULE

(75) Inventors: Takashi Ouchida, Gose (JP); Katsushi Kishimoto, Ikoma-gun (JP); Yasushi Fujioka, Souraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/901,618

(22) Filed: Jul. 11, 2001

(65) Prior Publication Data
US 2002/0026955 A1 Mar. 7, 2002

(30) Foreign Application Priority Data

| Jul. 21, 2000 | (JP) | 2000-221029 |
| Sep. 29, 2000 | (JP) | 2000-299525 |
| Sep. 29, 2000 | (JP) | 2000-299526 |

(51) Int. Cl.$^7$ .......................... H01L 31/024
(52) U.S. Cl. ............ 136/246; 136/244; 136/251; 136/258; 136/259; 136/261
(58) Field of Search ............. 136/244, 246, 136/249, 251, 258, 259, 261

(56) References Cited

U.S. PATENT DOCUMENTS

| 4,713,493 A | * | 12/1987 | Ovshinsky | 136/249 |
| 4,724,010 A | * | 2/1988 | Okaniwa et al. | 136/246 |
| 5,128,181 A | * | 7/1992 | Kunert | 428/34 |
| 5,176,758 A | * | 1/1993 | Nath et al. | 136/251 |
| 6,300,555 B1 | * | 10/2001 | Kondo et al. | 136/244 |

FOREIGN PATENT DOCUMENTS

| JP | 4-71276 | 3/1992 |
| JP | 7-202230 | 8/1995 |
| JP | 7-297435 | 11/1995 |
| JP | 11-103086 | 4/1999 |

OTHER PUBLICATIONS

Platz et al. "Hybrid Collectors Using Thin–Film Technology" Conference Record of the 26$^{th}$ IEEE Photovoltaic Specialists Conference. 1997. Pp. 1293–1296.*

* cited by examiner

Primary Examiner—Nam Nguyen
Assistant Examiner—Brian L. Mutschler
(74) Attorney, Agent, or Firm—Nixon & Vanderhye P.C.

(57) ABSTRACT

A thin-film solar cell module of a light transmission type includes a light-transmissive substrate; a front electrode layer; a rear electrode layer, and a photovoltaic conversion layer. The rear electrode layer, front electrode layer, and photovoltaic conversion layer are sequentially laminated on the light-transmissive substrate. A heat retention member covers the rear electrode layer, and a sealing layer is provided for sealing the rear electrode layer. In certain embodiments, the heat retention member has a light absorptance of 40% or more within a near-infrared wavelength range of 1,500 to 2,000 nm.

38 Claims, 8 Drawing Sheets

THIN-FILM SOLAR CELL MODULE

CROSS-REFERENCES TO RELATED APPLICATIONS

This application is related to Japanese Patent Applications Nos. 2000-221029 filed on Jul. 21, 2000, 2000-299525 filed on Sep. 29, 2000 and 2000-299526 filed on Sep. 29, 2000 whose priorities are claimed under 35 USC §119, the disclosures of which are incorporated by reference in their entirety.

BACKGROUND OF THE INVENTION

1. Field of the Invention

The present invention relates to a thin-film solar cell module, more particularly, a thin-film solar cell module including a solar cell element having a semiconductor layer of amorphous silicon.

2. Description of Related Art

Thin-film solar cell modules require a smaller amount of semiconductor material to be used than solar cell modules using crystal wafers. Also they can be formed on low-priced substrates such as glass substrates, metal substrates and the like by a low-temperature process. Therefore, the thin-film solar cell modules are expected to drop in price.

Among the thin-film solar cell modules, amorphous silicon solar cell modules are under active development since they are advantageous in that silicon, their material, exists in abundance and in that their material is harmless and does not affect the environment compared with compound solar cell modules using Cd and Se.

Among the amorphous silicon solar cell modules, thin-film solar cell modules of a light transmission type are also being developed which have the light take-in function of transmitting a part of incident light to the rear side in addition to the power generating function.

Generally, the amorphous silicon solar cell modules are roughly divided into the following two types according to their structure:

In one type, a transparent electroconductive film of $SnO_2$, ITO, ZnO or the like is formed on a light-transmissive insulative substrate of glass or the like. A p layer, an i layer and an n layer of amorphous semiconductors are sequentially laminated on the transparent electroconductive film to form a photovoltaic conversion layer, on which a transparent electroconductive film of ITO, ZnO or the like and a metal film of Ag, Al or the like are sequentially laminated to form a rear electrode.

In the other type, a transparent electroconductive film of ITO, ZnO or the like is formed on a metal substrate. A p layer, an i layer and an n layer of amorphous silicon semiconductors are laminated on the transparent electroconductive film to form a photovoltaic conversion layer, on which a transparent electroconductive film of $SnO_2$, ITO, ZnO or the like is formed.

Among these modules, in the amorphous silicon solar cell modules using light-transmissive insulating substrates of glass or the like, the following two processes are typically used for forming a light-transmissive portion for transmitting a part of incident light:

One is a wet process in which the rear electrode is formed partially on the photovoltaic conversion layer and the photovoltaic conversion layer exposed out from the rear electrode is etched away using the rear electrode as a mask.

The other is a dry process in which the photovoltaic conversion layer and the rear electrode are partially removed simultaneously by laser scribing.

After the light-transmissive portion is thus formed by either one of the processes, a rear electrode side is sealed by bonding a glass plate with an adhesive such as ethylene-vinyl acetate (referred to as EVA hereinafter in this specification), polyvinyl butyral (referred to as PVB hereinafter in this specification) or the like.

Materials for sealing the rear electrode side include a filler of EVA or PVB, a transparent PET sheet, a PET/aluminum film/PET laminate sheet, a transparent back sheet of Tedlar® (DUPONT) in addition to the glass plate.

The thus produced thin-film solar cell module of the light transmission type is placed outdoors for use with a frame of aluminum, stainless steel or the like attached to its periphery.

Typically the thin-film solar cell module of the light transmission type (referred to simply as "transmission type module" hereinafter in this specification) has a light-transmissive portion occupying about 1 to 50% of a power generating area, and therefore, has a lower power generation efficiency per unit area than a thin-film solar cell module of a non-transmission type (referred to simply as "non-transmission type module" hereinafter in this specification).

Accordingly, for generating a certain amount of power, more transmission type modules are required to be installed and occupy a larger installation area than the non-transmission type modules.

Under the above-described circumstances, it is desired that the transmission type modules have particularly high power generation efficiency. The modules in this specification mean a plurality of solar cells formed on a substrate which are electrically connected to each other.

On the other hand, typical amorphous silicon solar cell modules suffer an early-stage deterioration of conversion efficiency called Staebler-Wronski effect (referred to as "photo degradation" hereinafter in this specification).

The photo degradation is a problem where an amorphous silicon semiconductor is used for the photovoltaic conversion layer of a solar cell module which generates power from solar light outdoors.

There has not been found a method for completely eliminating the photo degradation of the amorphous silicon solar cell modules. However, a method is known for reducing the photo degradation by thinning the thickness of the amorphous silicon semiconductor layer in a stacked solar cell module of tandem or triple structure in which unit cells are stacked in two layers or three layers.

It is known that the conversion efficiency dropped by the photo degradation is recovered by raising the temperature of the amorphous silicon solar cell modules (referred to as "anneal effect"). This anneal effect can be observed at temperatures of about 40° C., but the effect is enhanced at higher temperatures. For example, the conversion efficiency is known to be greatly recovered at a temperature of about 70° C. or higher.

The temperature dependence of the output of the amorphous silicon solar cell modules is considerably smaller than that of the crystalline silicon solar cell modules. The output of the amorphous solar cell modules decreases about 0.1 to 0.2% when temperature rises about 1° C. Therefore, if the amorphous solar cell modules are used with keeping a high temperature, the conversion efficiency improves more owing to recovery from the photo degradation than the output drops due to the increased temperature.

In other words, if the amorphous silicon solar cell modules are used with keeping a high temperature to recover the photo degradation, the photo degradation is reduced and a high output can be obtained.

As a particular method for taking advantage of this temperature characteristic of the amorphous silicon solar cell modules to reduce the photo degradation, there is generally known a method of suppressing the radiation of heat of solar light from the rear face of the amorphous silicon solar cell modules by providing a thermal insulator to the rear face (see Japanese Unexamined Patent Publication No. HEI 4(1992)-71276, for example).

However, this prior-art technique has the following problems.

The provision of the thermal insulator to the rear face of the amorphous silicon solar cell modules (referred to simply as "solar cell modules" hereinafter in the specification) raises the highest temperature of the solar cell modules to about 70° C. in the daytime of summer. However, the temperature of the solar cell modules does not exceed about 70° C. in the other seasons.

Further, it is known that, if the above-described solar cell module having the thermal insulator is provided with a frame in its periphery for enhancing its strength, thermal conduction from the solar cell module to the frame increases.

That is, the heat of the solar cell module, especially of its periphery, is conducted to the frame and then radiated from the frame into the air. For this reason, the temperature of the periphery of the solar cell module, which is near the frame, is often lower by about 20° C. than the temperature of the center of the solar cell module.

Japanese Unexamined Patent Publication No. HEI 11(1999)-103086 discloses a method of suppressing the thermal conduction to the frame by providing a thermal insulator between the solar cell module and the frame.

However, this prior-art technique has the following problem.

(1) The insertion of the thermal insulation between the solar cell module and the frame decreases installation strength of the solar cell module and mechanical strength of the solar cell module.

(2) The thermal insulator is often made of polystyrene, which may cause environmental pollution, or polyurethane, polyethylene or the like which involves the risk of generation of dioxin during usual incineration. These are not suitable for the solar cell module, which is installed in a large area, for example, on a roof. On the other hand, if PET and phenol resin, which are little likely to cause environmental pollution, are used for thermal insulation, these materials need to be formed in a thickness of 20 cm or more for keeping the temperature of the module having a large area since thermal insulation coefficients of the materials are about 0.3. Therefore, disadvantageously, the size of the module itself increases and a large quantity of the thermal insulator is disposed of at the disposal of the module.

(3) The thermal insulator is usually bonded to the rear face of the module with an adhesive, which requires an additional man-hour after the module is produced. Moreover, the adhesion of the thermal insulator to the module is often insufficient, and therefore, the adhesive is deteriorated by infiltration of water or the like during long-term outdoor exposure and the function of the solar cell module declines. In order to suppress this deterioration, an additional layer of a waterproof sheet must be provided, which further increases production costs.

(4) The periphery of the solar cell module needs to be sealed to prevent the infiltration of water into the semiconductor layer. If the thermal insulator inserted between the solar cell module and the frame has an insufficient weatherability, the sealing property of the thermal insulator is liable to decline greatly owing to deterioration of the thermal insulator by light, and therefore the output of the solar cell decreases. Especially, where an expanded resin which has an excellent thermal insulation property is used as the thermal insulator, the installation strength and sealing property decline greatly.

The above-described prior techniques of providing the thermal insulator on the rear side of the solar cell module and between the solar cell module and the frame are not intended for the transmission type module. Accordingly, naturally, opaque thermal insulators have been used usually.

SUMMARY OF THE INVENTION

The present invention has been made under the above-described circumstances and an object thereof is to provide a thin-film solar cell module capable of suppressing the photo degradation and providing large output.

Certain embodiments of the present invention provide a thin-film solar cell module of a light transmission type comprising a light-transmissive substrate; a front electrode layer; a photovoltaic conversion layer; and a rear electrode layer. The front electrode layer, the photovoltaic conversion layer and the rear electrode layer are sequentially laminated on the light-transmissive substrate. A heat retention member covers the rear electrode layer, and a sealing layer is provided for sealing the rear electrode layer, wherein the heat retention member has a light absorptance of 40% or more within a near-infrared wavelength range of 1,500 to 2,000 nm.

The heat retention member may be formed of glass containing 1 to 50% by volume of gas therein.

The heat retention member may have a sealing layer and a thermal insulation layer formed on the sealing layer and the thermal insulation layer may be formed of a sheet-form silica aerogel.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
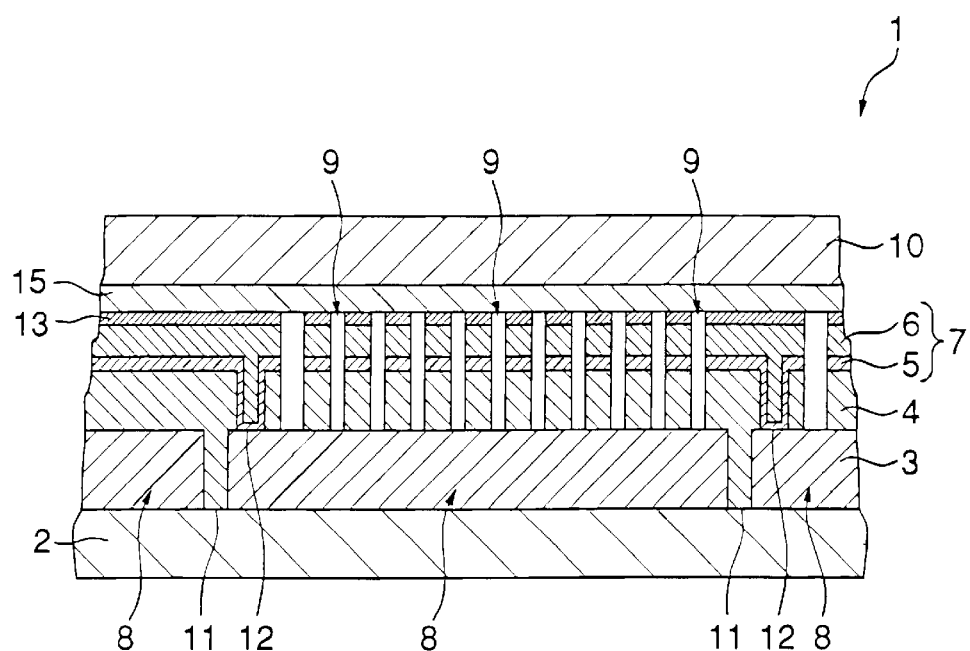
FIG. 1 is a partially enlarged sectional view of a transmission type thin-film solar cell module in accordance with Embodiment 1 of the present invention.

The present invention also provides thin-film solar cell module of a light transmission type comprising a light-transmissive substrate; a transparent front electrode layer; a photovoltaic conversion layer; a rear electrode layer, the front electrode layer, the photovoltaic conversion layer and the rear electrode layer being sequentially laminated on the light-transmissive substrate to form a solar cell; a light-transmissive portion running from the front electrode layer through the photovoltaic conversion layer and the rear electrode layer; and a light-transmissive sealing layer covering the rear electrode layer; wherein the sealing layer has a light absorptance of 40% or more within a near-infrared wavelength range of 1,500 to 2,000 nm.

According to this invention, the temperature of the transmission type thin-film solar cell module can be raised to enhance the annealing effect and reduce the photo degradation, without reducing the light take-in function.

The sealing layer is preferably formed of a blue glass plate having a light transmissivity of 70% or more within a visible light range of 400 to 800 nm. Such glass functions as heat absorbing glass.

The sealing layer is preferably formed of a glass plate having a zinc oxide film or a laminate film of a zinc oxide film and a silver film on a surface of the glass plate and has a light transmissivity of 70% or more within a visible light range of 400 to 800 nm. For since zinc oxide and silver are also materials for rear electrode layers of solar cell elements, such glass plates can be easily produced without need to make new investment in plant and equipment.

The present invention also provides a thin-film solar cell module of a light transmission type comprising: a light-transmissive substrate; a transparent front electrode layer; a photovoltaic conversion layer; a rear electrode layer, the front electrode layer, the photovoltaic conversion layer and the rear electrode layer being sequentially laminated on the light-transmissive substrate to form a solar cell; a light-transmissive portion running from the front electrode layer through the photovoltaic conversion layer and the rear electrode layer; and a light-transmissive sealing layer covering the rear electrode layer, wherein the sealing layer is formed of glass containing 1 to 50% by volume of gas therein.

According to this invention, the glass containing gas such as air has a lower thermal conductivity, and therefore is expected to have thermal insulating effect. The glass can prevent immediate radiation of heat absorbed in the transmission type thin-film solar cell module from the rear face of the module and keep the module at a high temperature. Therefore, the annealing effect can be enhanced and the photo degradation can be reduced.

The present invention provides a thin-film solar cell module of a light transmission type comprising a light-transmissive substrate; a transparent front electrode layer; a photovoltaic conversion layer; a rear electrode layer, the front electrode layer, the photovoltaic conversion layer and the rear electrode layer being sequentially laminated on the light-transmissive substrate to form a solar cell; a light-transmissive portion running from the front electrode layer through the photovoltaic conversion layer and the rear electrode layer; a light-transmissive sealing layer covering the rear electrode layer; and a light-transmissive thermal insulator covering the light-transmissive substrate or the sealing layer.

According to this invention, the heat absorbed in the transmission type module can be prevented from being radiated from immediately and the module can be maintained at a high temperature. Therefore, the annealing effect can be enhanced and the photo degradation can be reduced. Further, since the thermal insulator is light-transmissive, the light take-in function does not decline.

In this invention, the thermal insulator is preferably formed of a sheet-form silica aerogel. Since the silica aerogel has a low thermal conductivity and a high visible light transmissivity, the thermal insulation effect and the light take-in function can be exhibited to the maximum.

In this invention, preferably, the thin-film solar cell module of the light transmission type further comprises a frame surrounding a periphery of the module and the frame has a higher thermal emissivity on a substrate side of the frame than on a sealing layer side of the frame. The use of such a frame increases the absorption of solar light on the light-transmissive substrate side of the frame, i.e., on the light-receiving face of the frame, and decreases the heat emission from the sealing member side of the frame, i.e., on the non-light-receiving face of the frame. Thereby, less or no heat is conducted from the periphery of the transmission type module to the frame and the temperature of the periphery of the module rises. Therefore, the anneal effect is further enhanced and the photo degradation is reduced. Since the heat emission from the frame is reduced, the frame itself becomes hot. Therefore, a thermal insulation member need not be provided between the module and frame as in the prior art. The transmission type module can be fixed with the frame firmly.

In this invention, preferably, the substrate side of the frame is black or of a dark color of a shade similar to that of the photovoltaic conversion layer and the sealing layer side of the frame is silver or white. With this construction, the absorption of solar light increases on the light-receiving face of the frame. On the other hand, the heat emission is reduced on the non-light-receiving face of the frame. Thereby the temperature of the frame rises.

Certain embodiments of the present invention further provide a thin-film solar cell module comprising a solar cell element having a semiconductor layer of amorphous silicon, wherein a vacuum layer is formed on either or both of a light-receiving face and a non-light-receiving face of the solar cell element.

The provision of the vacuum layer enables a high thermal insulation effect to be obtained. The temperature of the solar cell element raised by light irradiation is maintained high, and therefore, the anneal effect can be enhanced. Thereby the photo degradation is suppressed and high output is obtained. Moreover, if the dimension (thickness) of the vacuum layer is reduced, the intended thermal insulation can be sufficient. The module can be reduced in size and resources for producing the module can be saved.

In this invention, the vacuum layer preferably has an inner pressure of 1 torr or less. If the vacuum degree of the vacuum layer is 1 torr or less, a thermal insulation coefficient of 0.1 or less can be obtained.

In this invention, preferably, the vacuum layer is provided on the non-light-receiving face of the solar cell element and the vacuum layer has a construction such that a core member is wrapped in a resin film for vacuum sealing and the inner pressure is maintained at 1 torr or lower. In this case, the thermal insulation coefficient on the non-light-receiving face of the solar cell element can be reduced to 0.1 or less (about one-third of that of common thermal insulation members). Thereby, even if the vacuum layer on the non-light-receiving face of the solar cell element is reduced in dimension (thickness), the intended thermal insulation effect can be obtained and the influence of the photo degradation can be suppressed. Also, since the dimension of the vacuum layer can be reduced, the module can be reduced in size and resources for producing the module can be saved.

In this invention, preferably, in the laminating step of sealing the non-light-receiving face of the solar cell element, the vacuum layer is formed by vacuum-sealing the resin film for vacuum sealing simultaneously with lamination. The simultaneous lamination and vacuum-sealing reduces the man-hour greatly. Furthermore, the film for lamination and the film for forming the vacuum layer are integrally formed and both the films fusion-bonded with the resin under reduced pressure. Therefore, the module and the vacuum layer have closer contact with each other.

As the resin film for vacuum sealing, it is preferable to use a resin film of PET on which aluminum is deposited and which is formed in a sac. The use of such a resin film not only enables the simultaneous lamination with the formation of the vacuum layer, but also can suppress changes with time of pressure rising due to the deposition of aluminum.

The resin film for vacuum sealing is preferably bonded to the non-light-receiving face of the solar cell element with a transparent resin. If the transparent resin is used as an adhesive, an EVA resin can be used as the rear-face filler of the solar cell element and the long-term reliability of the module can be ensured.

In the present invention, preferably, a chemical adsorbent which can adsorb a large amount of cyclopentane and carbon dioxide gas and keep the vacuum degree at 1 torr or lower is filled in the vacuum layer. With this construction, gases such as cyclopentane released from the core member are adsorbed, and therefore, the inner pressure can be suppressed at 1 torr for a long time.

In the present invention, preferably, the light-transmissive substrate on the light-receiving face of the solar cell element is formed of a multi-layered glass with a gap therebetween and the vacuum layer is formed in the gap. The heat emission from the light-transmissive substrate on the light-receiving face can be suppressed.

The present invention further provides a thin-film solar cell module wherein a frame is attached to the module, and the frame has a higher thermal emissivity on a light-receiving face of the frame than on a non-light-receiving face of the frame.

With this construction, the temperature of the frame around the module is raised by light absorption, and the temperature of the entire module rises. Thereby, the annealing effect is enhanced and the photo degradation is reduced greatly.

In the present invention, preferably, the frame is black or dark of a similar shade of that of the amorphous silicon semiconductor layer on its light-receiving face and white or silver on its non-light-receiving face. The absorption of solar light is increased on the light-receiving face of the frame and the heat emission is decreased on the non-light-receiving face of the frame.

In the present invention, preferably, the frame is black or dark of a similar shade of that of the amorphous silicon semiconductor layer on its light-receiving face and is provided with a thermal insulation means on its non-light-receiving face. The absorption of solar light is increased on the light-receiving face of the frame and the heat emission is decreased on the non-light-receiving face of the frame.

The present invention provides a thin-film solar cell module wherein a rear face of a solar cell element is sealed with a resin film, and the resin film has a higher thermal emissivity on a light-receiving face of the resin film than on a non-light-receiving face of the resin film.

With this construction, the absorption of solar light is increased on the light-receiving face of the frame and the heat emission is decreased on the non-light-receiving face of the frame. Thus, the temperature of the frame is raised by light irradiation. Heat in the periphery of the module does not escape toward the frame and the temperature of the periphery is raised. The annealing effect is enhanced and the photo degradation is reduced.

In the present invention, preferably, the resin film is black or dark of a similar shade of that of the amorphous silicon semiconductor layer on its light-receiving face and white or silver on its non-light-receiving face. The absorption of solar light is increased on the light-receiving face of the film and the heat emission is decreased on the non-light-receiving face of the film.

In the present invention, preferably, the resin film is a laminate film of a resin film black or dark of a similar shade of that of the amorphous silicon semiconductor layer, a white or silver resin film and an aluminum film sandwiched between the black or dark film and the white or silver film. The absorption of solar light is increased on the light-receiving face of the film and the heat emission is decreased on the non-light-receiving face of the film.

The present invention also provides a thin-film solar cell module comprising a solar cell element having a semiconductor layer of amorphous silicon and a thermal insulation means on a non-light-receiving face of the solar cell element for promoting temperature rise of the solar cell element by solar light, wherein a light-transmissive substrate of the solar cell element has an average light absorptance of 40% or more within a near-infrared wavelength range of 1,500 to 2,000 nm.

With this construction, infrared light which is not absorbed by the amorphous silicon semiconductor layer can be absorbed by the light-transmissive substrate. Therefore the light absorption by the whole solar cell element is increased and the annealing effect can be improved.

Figure 14:
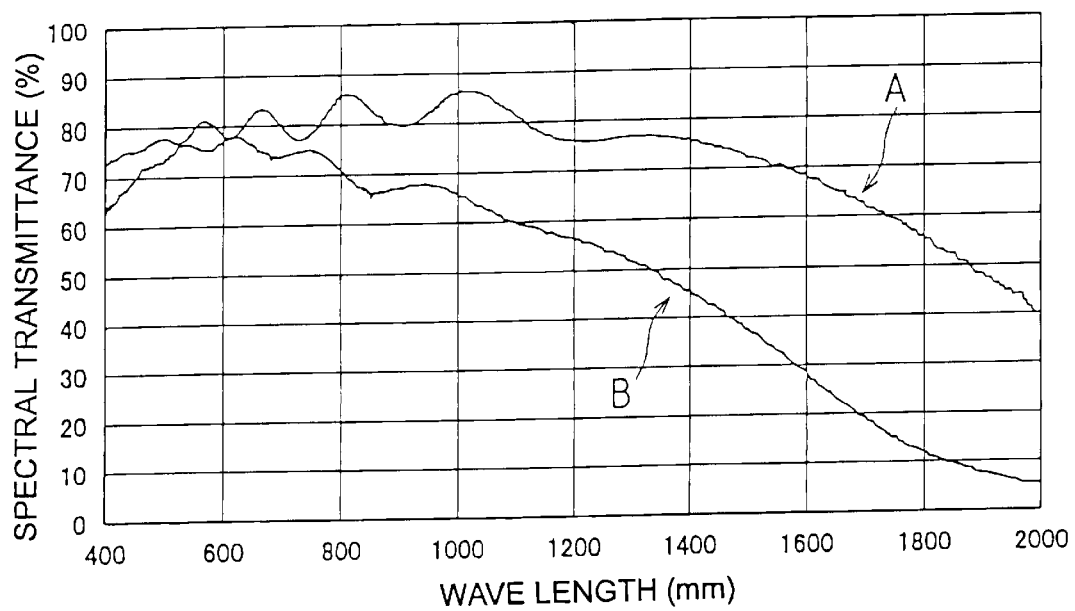
FIG. 14 is a graphical representation of spectral transmittance of light-transmissive substrates in accordance with Example 3 of the present invention.

In certain embodiments of the present invention, preferably, the light-transmissive substrate is formed of a blue glass plate which is provided with a transparent electroconductive film and has an average transmissivity of about 70% or more within the amorphous silicon semiconductor sensitivity wavelength range of 400 to 800 nm. By forming the transparent electroconductive film having a high visible light transmissivity and a high absorptance to infrared (e.g., an electroconductive film of tin oxide) on the blue glass plate having the effect of absorbing near-infrared, it becomes possible to obtain a light-transmissive substrate whose near-infrared absorption can be increased without increasing the visible light absorption, for example, a substrate having the characteristic indicated by a curved line B in FIG. 14.

First to Sixth Embodiments

The present invention is now described in detail by way of examples thereof with reference to the attached drawings. The examples, however, should not be construed to limit the scope of the invention.

First Embodiment

A transmission type thin-film solar cell module in accordance with Embodiment 1 of the present invention is explained with reference to FIGS. 1 to 3.

FIG. 1 is a partially enlarged view of a transmission type thin-film solar cell module 1 of Embodiment 1.

The transmission type thin-film solar cell module 1 is characterized in that a transparent front electrode layer 3, a photovoltaic conversion layer 4, and a rear electrode layer 7 composed of a transparent electroconductive film 5 and a metal film 6 are formed sequentially on a glass substrate 2 to form a solar cell 8, a light-transmissive portion 9 is formed to run through the front electrode layer 3, the photovoltaic conversion layer 4 and the rear electrode layer 7. The rear electrode layer 7 is covered with a light-transmissive sealing member 10, the sealing member 10 has a light absorptance of about 40% or more in a near-infrared wavelength range of about 1,500 to 2,000 nm, and thereby, the photovoltaic conversion efficiency is prevented from deteriorating.

Now is shown a production process of the transmission type solar cell module 1. The transparent front electrode layer 3 of $SnO_2$ was formed on the glass substrate 2 and patterned using a YAG fundamental wave laser.

More particularly, a laser beam was made incident from the glass substrate 2 to separate the front electrode layer 3 into strips to form front electrode layer separation lines 11. The glass substrate 2 was washed with pure water and the photovoltaic conversion layer 4 was formed by a plasma-enhanced CVD system. The photovoltaic conversion layer 4 was made up of a p layer, an i layer and an n layer of amorphous silicon. The sum of the thicknesses of the p, i and n layers was about 100 to 600 nm.

Subsequently, the photovoltaic conversion layer 4 was patterned using a YAG SHG laser. More particularly, a laser beam was made incident from the glass substrate 2 to separate the photovoltaic conversion layer 4 into strips to form photovoltaic conversion layer separation lines 12.

Thereafter, the rear electrode layer 7 composed of the transparent electroconductive film 5 and the metal film 6 was formed by a sputtering system. More particularly, a ZnO film was formed as the transparent electroconductive film 5 to a thickness of about 100 nm and then an Ag film was formed as the metal film 6 to a thickness of about 500 nm.

A resist film 13 colored in an optional color with a pigment was sprayed onto the rear electrode layer 7 to a thickness of about 1 to 10 μm and dried in a drying oven.

The rear electrode layer 7 was patterned by the YAG SHG laser. More particularly, a laser beam was made incident from the glass substrate 2 to separate the rear electrode layer 7 into strips to form rear electrode layer separation lines 14.

Thereafter, the light-transmissive portion 9 was formed in a power-generating area by patterning by the YAG SHG laser.

More particularly, the light-transmissive portion 9 was formed by making a laser beam incident from the glass substrate using a mask for forming the light-transmissive portion 9 in the form of discontinuous lines.

The light transmissivity can be set freely by changing the number and the length of the lines of the light-transmissive portion 9. In Embodiment 1, however, the light-transmissive portion 9 occupied about 10% of the total power generating area.

After the light-transmissive portion 9 was formed, remains of the rear electrode layer 7 were removed with an acidic etchant or an iron sulfide etchant.

A blue glass plate of the same size of the glass substrate 2 was bonded to the rear electrode layer 7 as the sealing member 10 with use of a sheet-form adhesive 15 of EVA through a laminating and a curing step, thereby forming a laminated glass structure with the glass substrate 2. The blue glass plate was about 4 mm thick. The blue glass plate is a low-cost material having a high visible light transmissivity and a light absorptance of about 40% or more in a near-infrared wavelength range.

As terminals, an anode and a cathode were taken from holes (not shown) opened in the sealing member 10 so that electric power was taken out via a terminal box (not shown) attached to the sealing member 10.

Figure 2:
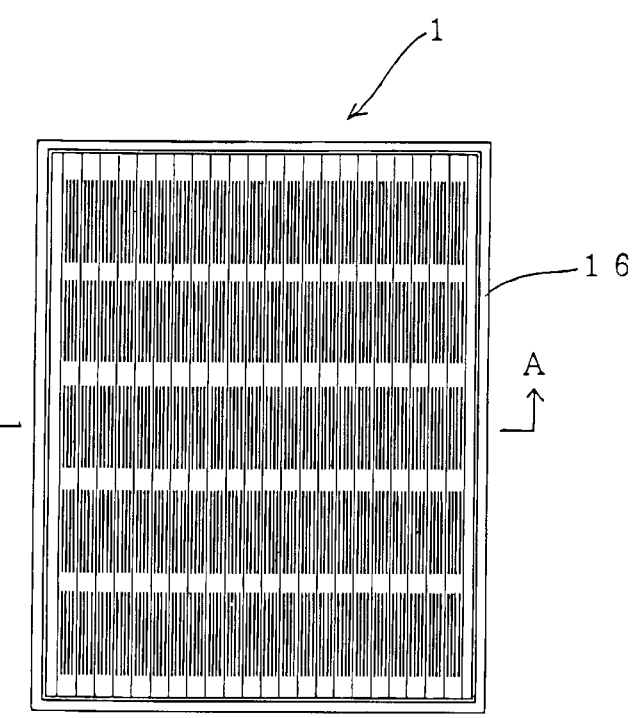
FIG. 2 is a plan view illustrating a transmission type thin-film solar cell module in accordance with Embodiment 1 of the present invention with a frame attached thereto.
Figure 3:
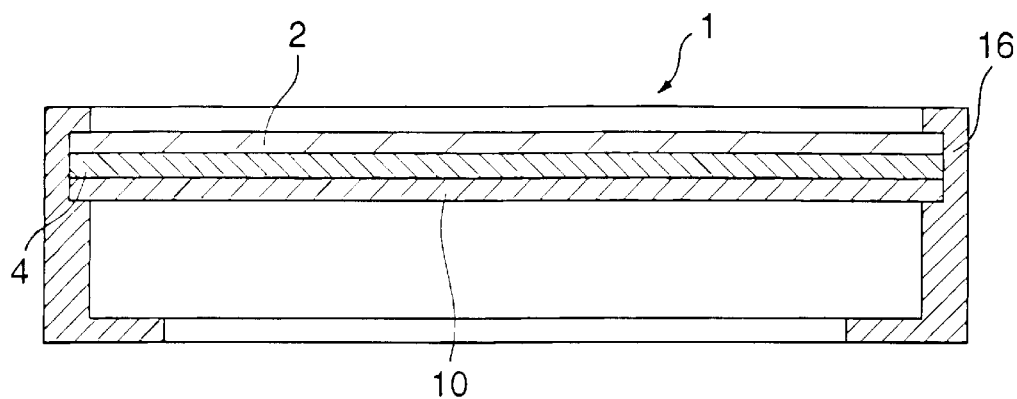
FIG. 3 is a schematic sectional view taken on line A—A in FIG. 2.

Thereafter, as shown in FIGS. 2 and 3, an aluminum frame 16 was attached to the periphery of the transmission type thin-film solar cell module 1 with intervention of butyl rubber (not shown). Thus the transmission type thin-film solar cell module 1 was completed.

FIG. 2 is a plan view of the transmission type thin-film solar cell module 1 with the frame 16 attached thereto, and FIG. 3 is a schematic section view taken on line A-A' in FIG. 2. Detailed structure of the transmission type thin-film solar cell module 1, the butyl rubber, the terminals and the terminal box are not shown in either of FIGS. 2 and 3.

Comparative Example

Figure 9:
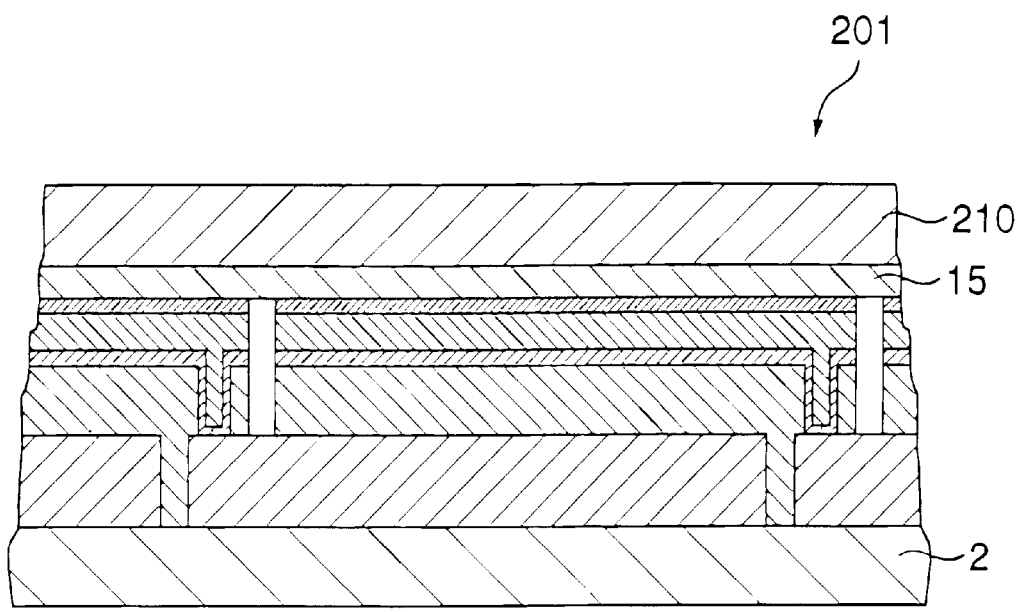
FIG. 9 is a partially enlarged sectional view of a transmission type thin-film solar cell module produced as a comparative example.

A non-transmission type thin-film solar cell module 201 produced for comparison with the transmission type thin-film solar cell module according to the present invention is briefly explained with reference to FIG. 9. As shown in FIG. 9, the non-transmission type thin-film solar cell module 201 is not provided with a light-transmissive portion 9 as in Embodiment 1, and a thermal insulator 210 of glass fiber, instead of the sealing member 10 of Embodiment 1, is bonded with an EVA adhesive 15. The thermal insulator 210 has the same dimensions as those of the glass substrate 2 and its thickness is about 2 mm. Other construction is the same as that of Embodiment 1.

The above-described non-transmission type thin-film solar cell module 201 was attached to the same frame 16 as used in Embodiment 1 with butyl rubber, thereby forming a module of the comparative example.

The transmission type thin-film solar cell module 1 of Embodiment 1 and the non-transmission type thin-film solar cell module 201 of the comparative example were installed outdoors and they were observed about changes in their temperature and photovoltaic conversion efficiency.

In the comparative example, the temperature of the module was only about 40 degrees higher at the center of the module and only about 25 degrees higher at the periphery of the module than the ambient temperature in summer.

In Embodiment 1, the average temperature of the entire module was about 30 to 45 degrees higher than the ambient temperature and reached about 60 to 75° C. in summer.

As a result, a photo degradation of about 24% on the annual average was observed with the comparative example, but a photo degradation of about 22% on the annual average was observed with Embodiment 1. Thus improvement was confirmed with Embodiment 1.

Second Embodiment

Figure 4:
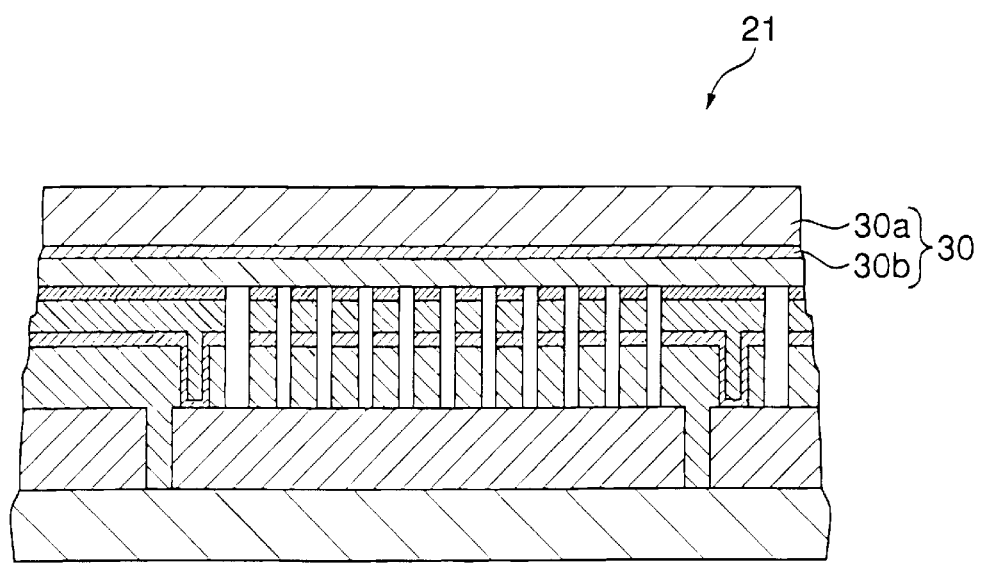
FIG. 4 is a partially enlarged sectional view of a transmission type thin-film solar cell module in accordance with Embodiment 2 of the present invention.

A transmission type thin-film solar cell module in accordance with Embodiment 2 of the present invention is explained with reference to FIG. 4. FIG. 4 is a partially enlarged view of a transmission type thin-film solar cell module 21 of Embodiment 2.

As shown in FIG. 4, in the transmission type thin-film solar cell module 21, a glass plate 30a with a zinc oxide film 30b of about 1 µm thickness formed thereon was used as a sealing member 30. Other construction and the formation of each member are the same as those of the transmission type thin-film solar cell module 1 of Embodiment 1, and therefore, explanation is not given thereof.

The transmission type thin-film solar cell module 21 of Embodiment 2 and the non-transmission type thin-film solar cell module 201 of the comparative example were installed outdoors and they were observed about changes in their temperature and photovoltaic conversion efficiency.

In the comparative example, the temperature of the module was only about 40 degrees higher at the center of the module and only about 25 degrees higher at the periphery of the module than the ambient temperature in summer.

In Embodiment 2, the average temperature of the entire module was about 35 to 50 degrees higher than the ambient temperature and reached about 65 to 80° C. in summer.

As a result, a photo degradation of about 24% on the annual average was observed with the comparative example, but a photo degradation of about 21% on the annual average was observed with Embodiment 2. Thus improvement was confirmed with Embodiment 2.

Although the glass plate 30a with the zinc oxide film 30b of about 1 µm thickness formed thereon was used as the sealing member 30, it is better to use a laminate film of a zinc oxide film and a silver film optimized as a heat absorbing film in place of the zinc oxide film.

Such a glass plate is suitable as the sealing member of the transmission type thin-film solar cell module of the present invention since it functions as heat absorbing glass.

Since zinc oxide and silver are also materials for the rear electrode layer, the glass plate having the zinc oxide film and/or the silver film can be produced easily without making new investment in plant and equipment.

Third Embodiment

Figure 5:
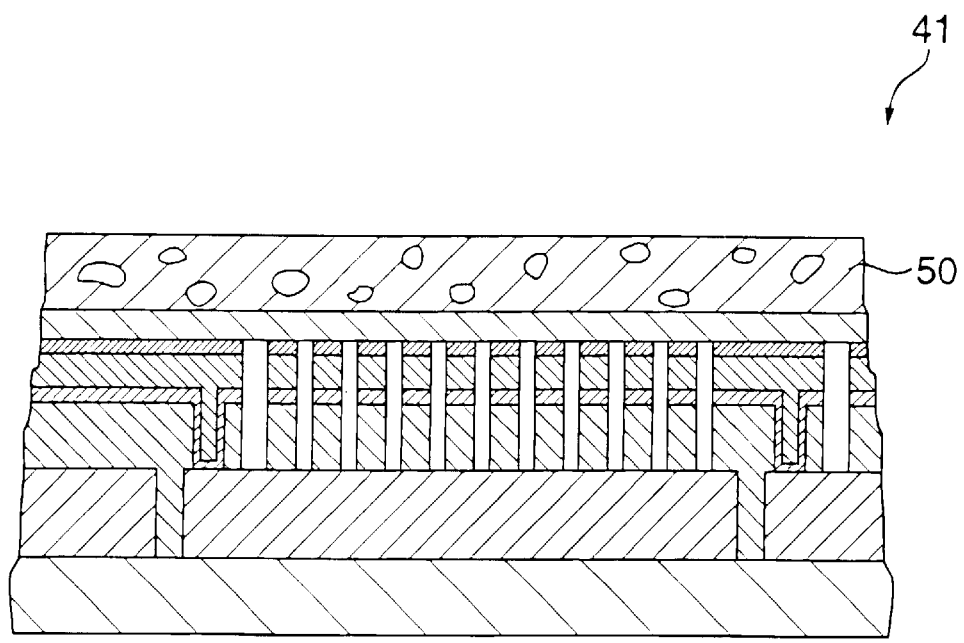
FIG. 5 is a partially enlarged sectional view of a transmission type thin-film solar cell module in accordance with Embodiment 3 of the present invention.

A transmission type thin-film solar cell module in accordance with Embodiment 3 of the present invention is explained with reference to FIG. 5. FIG. 5 is a partially enlarged view of a transmission type thin-film solar cell module 41 of Embodiment 3.

As shown in FIG. 5, in the transmission type thin-film solar cell module 41, a glass plate containing about 10% by volume of air was used as a sealing member 50. Other construction and the formation of each member are the same as those of the transmission type thin-film solar cell module 1 of Embodiment 1, and therefore, explanation is not given thereof.

The transmission type thin-film solar cell module 41 of Embodiment 3 and the non-transmission type thin-film solar cell module 201 of the comparative example were installed outdoors and they were observed about changes in their temperature and photovoltaic conversion efficiency.

In the comparative example, the temperature of the module was only about 40 degrees higher at the center of the module and only about 25 degrees higher at the periphery of the module than the ambient temperature in summer.

In Embodiment 3, the average temperature of the entire module was about 35 to 50 degrees higher than the ambient temperature and reached about 65 to 80° C. in summer.

As a result, a photo degradation of about 24% on the annual average was observed with the comparative example, but a photo degradation of about 21% on the annual average was observed with Embodiment 3. Thus improvement was confirmed with Embodiment 3.

The glass containing about 1 to 50% by volume of gas is used because the thermal insulation effect is insufficient if the volume ratio of the gas contained in the glass is about less than 1% and the sealing member becomes weak in strength if it exceeds about 50%.

Fourth Embodiment

Figure 6:
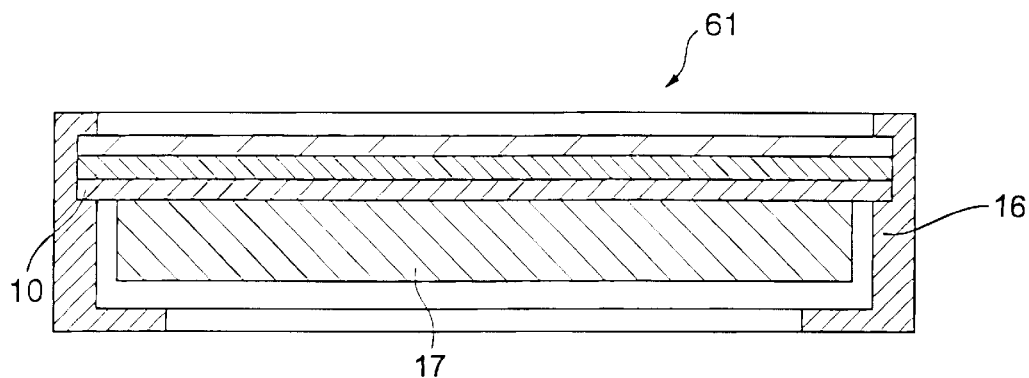
FIG. 6 is a schematic sectional view of a transmission type thin-film solar cell module in accordance with Embodiment 4 of the present invention.

A transmission type thin-film solar cell module in accordance with Embodiment 4 of the present invention is explained with reference to FIG. 6. FIG. 6 is a schematic sectional view of a transmission type thin-film solar cell module 61 of Embodiment 4, corresponding to FIG. 3 of Embodiment 1. Like numbers denote members having like names and constructions as those of Embodiments 1 to 3.

As shown in FIG. 6, in the transmission type thin-film solar cell module 61, a thermal insulator 17 was bonded to the sealing member 10 of the transmission type thin-film solar cell module 1 of the Embodiment 1 (see FIGS. 1 and 3) using an adhesive of a transparent silicone resin.

The thermal insulator 17 was formed of a silica aerogel having a thermal conductivity of about 0.02 kcal/mh° C. and a visible light transmissivity of about 90% and its thickness was about 10 mm.

The thermal insulator may be bonded not only by use of the above-mentioned transparent silicone resin but also by lamination using EVA as an adhesive or by applying the thermal insulator directly to the module and curing it.

Other construction and the formation of each member are the same as those of the transmission type thin-film solar cell module 1 of Embodiment 1, and therefore, explanation is not given thereof.

The transmission type thin-film solar cell module 61 of Embodiment 4 and the non-transmission type thin-film solar cell module 201 of the comparative example were installed outdoors and they were observed about changes in their temperature and photovoltaic conversion efficiency.

In the comparative example, the temperature of the module was only about 40 degrees higher at the center of the module and only about 25 degrees higher at the periphery of the module than the ambient temperature in summer.

In Embodiment 4, the average temperature of the entire module was about 42 to 55 degrees higher than the ambient temperature and reached about 72 to 85° C. in summer.

As a result, a photo degradation of about 24% on the annual average was observed with the comparative example, but a photo degradation of about 20% on the annual average was observed with Embodiment 4. Thus improvement was confirmed with Embodiment 4.

The transmission type thin-film solar cell module of the present invention is so constructed that the thermal insulator is brought in close contact with the module by covering the light-transmissive substrate or the sealing member with the light-transmissive thermal insulator. Thereby, heat absorbed in the module can be prevented from being radiated immediately so that the module is maintained at a high temperature. Thus the annealing effect can be enhanced and the photo degradation can be reduced. Since the thermal insulator is light-transmissive, the light take-in function does not decline.

The thermal insulator desirably has a small thermal conductivity and a high visible light transmissivity. For example, usable are a methacrylic resin, a polycarbonate resin, a polystyrene resin, a polyolefin polymerized with a metallocene catalyst, a polyester resin, a transparent fluoroplastic, a polyimide resin and the like which belong to transparent resins. Particularly, with use of silica aerogel having a thermal conductivity of about 0.02 kcal/mh° C. and a visible light transmissivity of about 90%, the thermal insulation effect and the light take-in function can be exhibited to the maximum.

Since the thermal insulator becomes hot, the thermal insulator is desirably excellent in thermal resistance and weatherability when irradiated with light. Further, desirably, it does not generate pollutants such as dioxin when burned.

Fifth Embodiment

Figure 7:
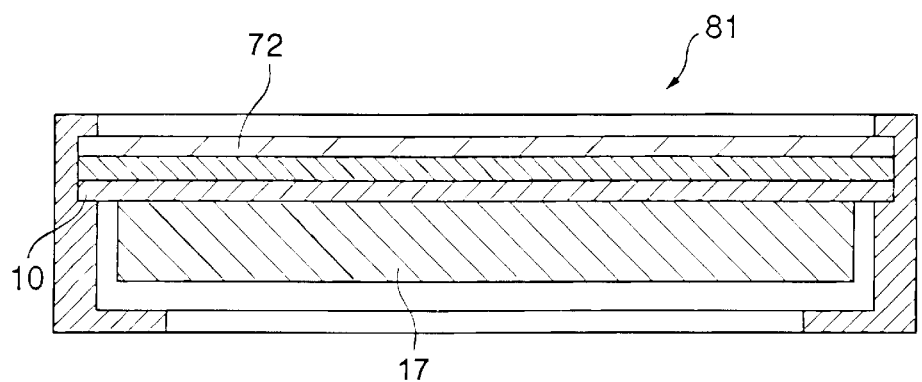
FIG. 7 is a schematic sectional view of a transmission type thin-film solar cell module in accordance with Embodiment 5 of the present invention.

A transmission type thin-film solar cell module in accordance with Embodiment 5 of the present invention is explained with reference to FIG. 7. FIG. 7 is a schematic sectional view of a transmission type thin-film solar cell module 81 of Embodiment 5, corresponding to FIG. 3 of Embodiment 1. Like numbers denote members having like names and constructions as those of Embodiments 1 to 4.

As shown in FIG. 7, in the transmission type thin-film solar cell module 81, the glass substrate 2 and the front electrode layer 3 of the transmission type thin-film solar cell module 1 of Embodiment 1 (see FIGS. 1 and 3) were changed to a blue glass plate 72 with a transparent electro-conductive film of tin oxide deposited by thermal CVD.

Also, as in the above-described Embodiment 4, a thermal insulator 17 was bonded to the sealing member 10 using an adhesive of a transparent silicone resin.

Other construction and the formation of each member are the same as those of the transmission type thin-film solar cell module 1 of Embodiment 1, and therefore, explanation is not given thereof.

For mounting the thermal insulator on the transparent substrate or the sealing member, an adhesive is used. As particular examples thereof, may be mentioned an adhesive of a transparent silicone resin and an adhesive of EVA.

The transmission type thin-film solar cell module 81 of Embodiment 5 and the non-transmission type thin-film solar cell module 201 of the comparative example were installed outdoors and they were observed about changes in their temperature and photovoltaic conversion efficiency.

In the comparative example, the temperature of the module was only about 40 degrees higher at the center of the module and only about 25 degrees higher at the periphery of the module than the ambient temperature in summer.

In Embodiment 5, the average temperature of the entire module was about 50 to 60 degrees higher than the ambient temperature and reached about 80 to 90° C. in summer.

As a result, a photo degradation of about 24% on the annual average was observed with the comparative example, but a photo degradation of about 18% on the annual average was observed with Embodiment 5. Thus improvement was confirmed with Embodiment 5.

For the transmission type thin-film solar cell module of the present invention, may be used a light-transmissive substrate having an average light absorptance of about 40% or more within the near-infrared wavelength range of about 1,500 to 2,000 nm.

As such a light-transmissive substrate, may be mentioned a substrate of a blue glass plate with a transparent electro-conductive film having an average transmissivity of about 70% or more within an amorphous silicon semiconductor sensitivity wavelength range of about 400 to 800 nm.

Sixth Embodiment

Figure 8:
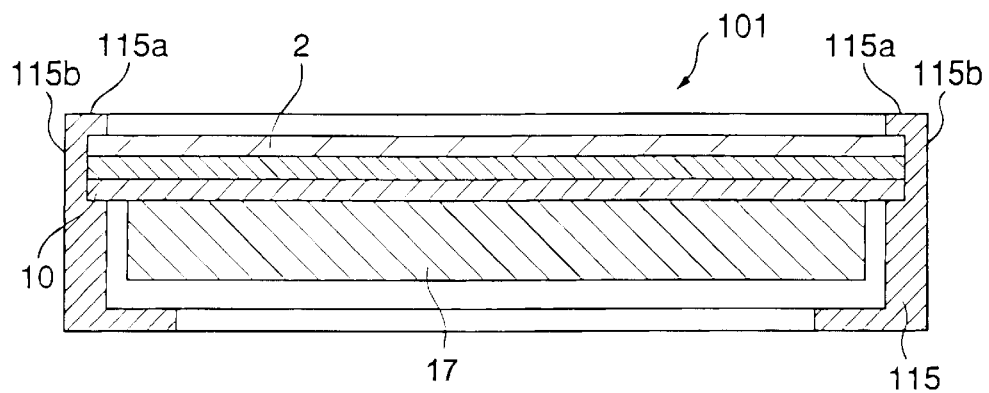
FIG. 8 is a schematic sectional view of a transmission type thin-film solar cell module in accordance with Embodiment 6 of the present invention.

A transmission type thin-film solar cell module in accordance with Embodiment 6 of the present invention is explained with reference to FIG. 8. FIG. 8 is a schematic sectional view of a transmission type thin-film solar cell module 101 of Embodiment 6, corresponding to FIG. 3 of Embodiment 1. Like numbers denote members having like names and constructions as those of Embodiments 1 to 5.

As shown in FIG. 8, in the transmission type thin-film solar cell module 101, the frame 16 of the transmission type thin-film solar cell module 1 of Embodiment 1 (see FIG. 3) was changed to a frame 115 whose color was black on a face directly receiving solar light (light-receiving face) and silver on other faces (non-light-receiving faces). In FIG. 8, black portions of the frame 115 were a surface 115a in parallel with the glass substrate 2 and a side face 115b bent substantially perpendicularly from the surface 115a.

Also, as in the above-described Embodiment 4, a thermal insulator 17 was bonded to the sealing member 10 using an adhesive of a transparent silicone resin.

The transmission type thin-film solar cell module 101 of Embodiment 6 and the non-transmission type thin-film solar cell module 201 of the comparative example were installed outdoors and they were observed about changes in their temperature and photovoltaic conversion efficiency.

In the comparative example, the temperature of the module was only about 40 degrees higher at the center of the module and only about 25 degrees higher at the periphery of the module than the ambient temperature in summer.

In Embodiment 6, the average temperature of the entire module was about 45 to 55 degrees higher than the ambient temperature and reached about 75 to 85° C. in summer.

As a result, a photo degradation of about 24% on the annual average was observed with the comparative example, but a photo degradation of about 19% on the annual average was observed with Embodiment 6. Thus improvement was confirmed with Embodiment 6.

Table 1 shows temperature rises from the ambient temperature and photo degradation ratios in the comparative example and Embodiments 1 to 6. For obtaining the temperature rises from the ambient temperature, the temperature at the center of the module was measured for the comparative example and the average temperature over the surface of the modules was calculated for Embodiments 1 to 6.

The photo degradation ratio n was calculated according to the following formula:

$$\text{Photo degradation ratio } n = (n_I - n_S)/n_I \times 100$$

(wherein $n_I$ represents initial efficiency and $n_S$ represents stabilized efficiency).

TABLE 1

|  | Prior Art | Ex. 1 | Ex. 2 | Ex. 3 | Ex. 4 | Ex. 5 | Ex. 6 |
|---|---|---|---|---|---|---|---|
| Temp. rises from ambient temp. (by deg.) | 25–40 | 30–45 | 35–50 | 35–50 | 42–55 | 50–60 | 45–55 |

TABLE 1-continued

|  | Prior Art | Ex. 1 | Ex. 2 | Ex. 3 | Ex. 4 | Ex. 5 | Ex. 6 |
|---|---|---|---|---|---|---|---|
| Light deterioration ratio (%) | 24 | 22 | 21 | 21 | 20 | 18 | 19 |

In Embodiment 6 of the present invention, the substrate side of the frame may be black or dark and a thermal insulator may be mounted on the sealing member side of the frame. That is, the thermal insulator may be used instead of making the sealing member side of the frame white or silver.

If such a frame is used for a non transmission type module, it is sure to exhibit the same effect.

Seventh Embodiment

Figure 10:
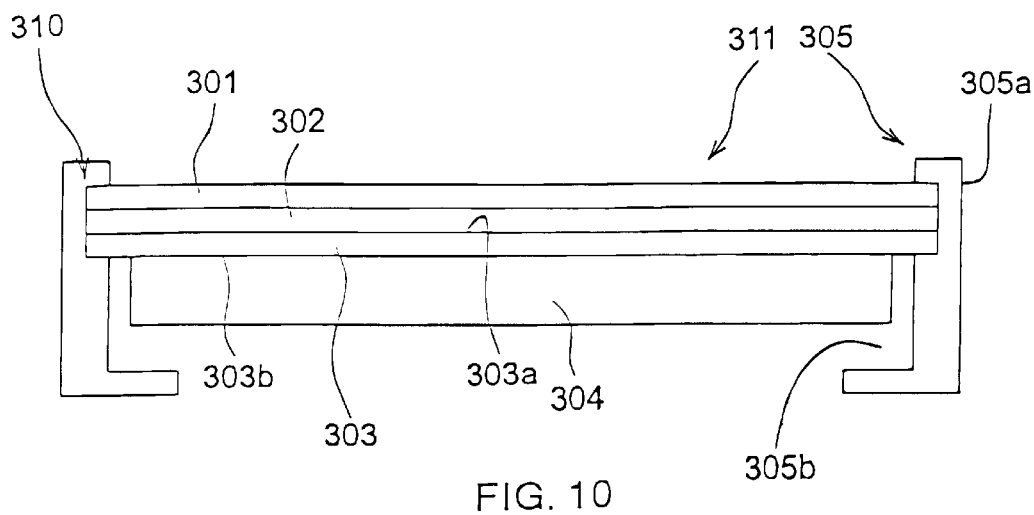
FIG. 10 is a schematic sectional view of a transmission type thin-film solar cell module in accordance with another embodiment of the present invention.

FIG. 10 is a schematic sectional view illustrating the construction of another embodiment of the present invention.

The thin-film solar cell module of FIG. 10 has a construction such that a solar cell panel 311 is fitted in and bonded to an aluminum frame 305 using butyl rubber. The solar cell panel 311 includes a solar cell element 310 in which an amorphous silicon semiconductor layer 302 is formed on a light-transmissive substrate 301, a rear-face sealing resin film 303 (white on both faces) for sealing a rear face (a non-light-receiving face) of the solar cell element 310, and a vacuum thermal insulation layer 304 provided on the non-light-receiving face of the solar cell element 310.

In the solar cell element 310, a photovoltaic conversion layer is formed on the light-transmissive substrate 301. The rear face (the non-light-receiving face) is sealed with a filler (not shown) such as EVA, PVB, polyisobutylene resin or the like. The photovoltaic conversion layer is formed of a laminate of a transparent electroconductive film (not shown)/an amorphous silicon semiconductor layer 302 of p-i-n (or n-i-p)/a metal electrode layer sequentially deposited on the substrate 301. The rear face of the solar cell element 310 is protected by the rear-face sealing film 303 of PET, Tedlar® or the like. The rear-face sealing film 303 may have aluminum foil inserted therein as required.

Here, as the light-transmissive substrate 301, a substrate of reinforced glass or laminated glass and other common light-transmissive substrates are usable.

The transparent electroconductive film may be formed of tin oxide or indium oxide as in prior-art solar cell elements.

The amorphous silicon semiconductor layer 302 may be formed of amorphous silicon, amorphous silicon carbide, amorphous silicon germanium or the like.

The metal electrode layer may be formed of a common metal material such as chromium, aluminum, silver or the like, among which silver is preferred from the viewpoint of effect on enclosure of light and reflectivity.

Since the temperature of the solar cell element becomes high, there is a problem of diffusion of the metal component between the amorphous silicon semiconductor layer 302 and the metal electrode layer. For the purpose of preventing this diffusion, it is preferable to interpose a transparent electroconductive film of zinc oxide or the like between the amorphous silicon semiconductor layer 302 and the metal electrode layer.

In the case where EVA, PVB and the like are used as a filler for sealing the rear face of the amorphous silicon semiconductor layer 302, the rear-side sealing resin film 303 is preferably bonded by vacuum lamination.

The vacuum thermal insulation layer 304 is formed by putting a core member described later in a bag made of a resin such as PET, preferably a PET/aluminum/PET bag, and sucking with a rotary pump or the like so that internal pressure becomes 1 torr or lower. The formation of the vacuum thermal insulation layer 304 is preferably conducted simultaneously with the aforesaid vacuum lamination of the rear-face sealing resin film 303 in view of reduction in the man-hour. Where the vacuum thermal insulation layer 304 has a vacuum degree of 1 torr or less, the thermal insulation effect improves greatly in particular (a thermal insulation coefficient of 0.1% or less).

In the vacuum thermal insulation layer 304, it is preferable to fill a chemical adsorbent which adsorbs a large amount of cyclopentane or carbon dioxide gas at 25 to 70° C. and allows the vacuum degree to be maintained at 1 torr or lower. As such a chemical adsorbent, a getter material containing a Ba—Li alloy or the like may be mentioned.

The core member of the vacuum thermal insulation layer 304 is formed of a material excellent in thermal insulating properties, heat retaining properties and heat accumulating properties. As such materials, are usable expanded materials such as polystylene foam, polyethylene foam, rigid polyurethane foam, phenol foam, silicon rubber foam, polypropylene and polyisocyanurate, fiber materials such as rock wool, glass wool, ceramic fiber, animal fiber and vegetable fiber, granular and powdery materials such as calcium silicate, diatomaceous earth and cork, lightweight cellular concrete and the like.

Here, since the vacuum thermal insulation layer 304 becomes hot, the vacuum thermal insulation layer 304 preferably has excellent thermal insulating properties and an excellent weatherability when heated and irradiated with light. Desirably, it does not generate pollutant substances such as dioxin when burned.

EXAMPLE 1

As shown in FIG. 10, an amorphous silicon semiconductor layer 302 was formed on a light-transmissive substrate 301 having a transparent electroconductive film formed on the surface thereof to form a solar cell element 310. A rear-face sealing resin film 303 and a vacuum thermal insulation layer 304 were bonded to a non-light-receiving face of the solar cell element 310 with EVA to form a solar cell panel 311. The solar cell panel 311 was fitted in and bonded to an aluminum frame 305 with butyl rubber. Thus a thin-film solar cell module was produced. The vacuum thermal insulation layer 304 is formed by wrapping a core member of polyurethane foam using a resin film of PET with aluminum deposited thereon and vacuuming to 1 torr or lower, followed by sealing.

This thin-film solar cell module was installed outdoors and changes in its temperature and photovoltaic conversion efficiency were observed. The temperature of the prior-art module was only about 40 degrees higher at the maximum even at the center of the module than the ambient temperature in summer. However, as regards the thin-film solar cell module of this Example 1, the temperature of the entire module was about 50 to 60 degrees higher than the ambient temperature and reached about 80 to 90° C. in summer. Also, the prior-art module exhibited a photo degradation of about 24% on the annual average, but the thin-film solar cell module of Example 1 exhibited a photo degradation of about 19% on the annual average. Thus great improvement was confirmed with Example 1.

EXAMPLE 2

A thin-film solar cell module was produced in the same manner as in Example 1 except that, as the vacuum thermal insulation layer 304, a vacuum layer was formed of bilayered glass by providing a glass plate on the rear face of the light-transmissive glass substrate 301 so that a gap capable of being vacuumed was formed between the two glass plates and vacuuming the gap to 1 torr or lower, instead of wrapping the core member of polyurethane foam using the resin film of PET with aluminum deposited thereon and vacuuming to 1 torr or lower, followed by sealing.

This thin-film solar cell module was installed outdoors and changes in its temperature and photovoltaic conversion efficiency were observed. The temperature of the prior-art module was only about 40 degrees higher at the maximum even at the center of the module than the ambient temperature in summer. However, as regards the thin-film solar cell module of this Example 2, the temperature of the entire module was about 48 to 58 degrees higher than the ambient temperature and reached about 78 to 88° C. in summer. Also, the prior-art module exhibited a photo degradation of about 24% on the annual average, but the thin-film solar cell module of Example 2 exhibited a photo degradation of about 20% on the annual average. Thus great improvement was confirmed with Example 2.

If a chemical adsorbent which can adsorb a large amount of cyclopentane and carbon dioxide and keep the degree of vacuum at 1 torr or lower is filled when the core member is put in the vacuum layer, gases such as cyclopentane released from the core member are adsorbed, and therefore, the inner pressure can be suppressed at 1 torr for a long time.

Here, lamination for sealing the rear face of the solar cell element with a resin film is usually performed at a negative pressure of 1 torr or less at a temperature of 130° C. for defoaming between a back film and a resin film. A laminating apparatus used for a laminating step has a mechanism for making the back film into the form of a sac and thermally fusion-bonding an opening in a vacuum state. Therefore, in the laminating step, the lamination can be carried out at the same time as the resin film for vacuum sealing is vacuum-sealed for forming the vacuum layer. This simultaneous lamination and vacuum sealing can reduce the man-hour greatly. Furthermore, the film for lamination and the film for forming the vacuum layer are integrally formed and both the films fusion-bonded with the resin under reduced pressure. Therefore, the module and the vacuum layer have closer contact with each other.

Eighth Embodiment

Figure 11:
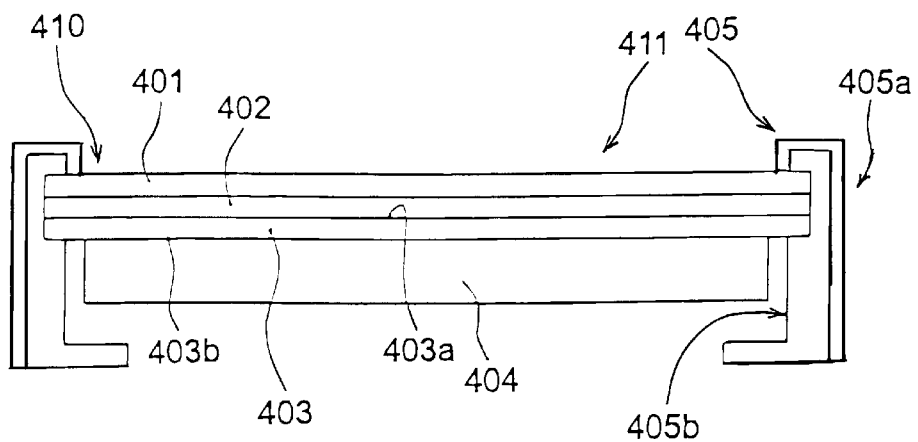
FIG. 11 is a schematic sectional view of a thin-film solar cell module in accordance with another embodiment (Example 1) of the present invention.

FIG. 11 is a schematic view of the construction of another embodiment of the present invention.

The thin-film solar cell module of FIG. 11 has a construction such that a solar cell panel 411 is fitted in and bonded to an aluminum frame 405 using butyl rubber. The solar cell panel 411 includes a solar cell element 410 in which an amorphous silicon semiconductor layer 402 is formed on a light-transmissive substrate 401, a rear-face sealing resin film 403 for sealing a rear face (a non-light-receiving face) of the solar cell element 410, and a thermal insulation layer 404 provided on the non-light-receiving face of the solar cell element 410.

The frame 405 was black on its light-receiving face 405a and silver (color of aluminum) on its non-light-receiving face 405b.

In the solar cell element 410, a photovoltaic conversion layer is formed on the light-transmissive substrate 401. The rear face (the non-light-receiving face) is sealed with a filler (not shown) such as EVA, PVB, polyisobutylene resin or the like. The photovoltaic conversion layer is formed of a laminate of a transparent electroconductive film (not shown)/an amorphous silicon semiconductor layer 402 of p-i-n (or n-i-p)/a metal electrode layer (not shown) sequentially deposited on the substrate 401. The rear face of the solar cell element 410 is protected by the rear-face sealing film 403 of PET, Tedlar® or the like. The rear-face sealing film 403 may have aluminum foil inserted therein as required. As the rear-face sealing resin film 403, is used a film having a white light-receiving face 403a and a white non-light-receiving face 403b or a film having a black light-receiving 403a and a white non-light-receiving face 403b.

Here, as the light-transmissive substrate 401, a substrate of reinforced glass or laminated glass and other common light-transmissive substrates are usable.

The transparent electroconductive film may be formed of tin oxide or indium oxide as in prior-art solar cell elements.

The amorphous silicon semiconductor layer 402 may be formed of amorphous silicon, amorphous silicon carbide, amorphous silicon germanium or the like.

The metal electrode layer may be formed of a common metal material such as chromium, aluminum, silver or the like, among which silver is preferred from the viewpoint of effect on enclosure of light and reflectivity.

Since the solar cell element 410 becomes hot, there is a problem of diffusion of the metal component between the amorphous silicon semiconductor layer 402 and the metal electrode layer. For the purpose of preventing this diffusion, it is preferable to interpose a transparent electroconductive film of zinc oxide or the like between the amorphous silicon semiconductor layer 402 and the metal electrode layer.

In the case where EVA, PVB and the like are used as a filler for sealing the rear face of the amorphous silicon semiconductor layer 402, the rear-side sealing resin film 403 is preferably bonded by vacuum lamination.

The thermal insulation layer 404 may be a thermal insulator, a dry air layer or the like. The thermal insulator may formed of materials excellent in thermal insulation, heat retention and heat accumulation, for example, expanded materials such as polystyrene foam, polyethylene foam, rigid polyurethane foam, phenol foam, silicon rubber foam, polypropylene and polyisocyanurate, fiber materials such as rock wool, glass wool, ceramic fiber, animal fiber and vegetable fiber, granular and powdery materials such as calcium silicate, diatomaceous earth and cork, lightweight cellular concrete and the like.

Here, since the vacuum thermal insulation layer 404 becomes hot, the vacuum thermal insulation layer 404 preferably has excellent thermal insulating properties and an excellent weatherability when heated and irradiated with light. Desirably, it does not generate pollutant substances such as dioxin when burned.

Figure 12:
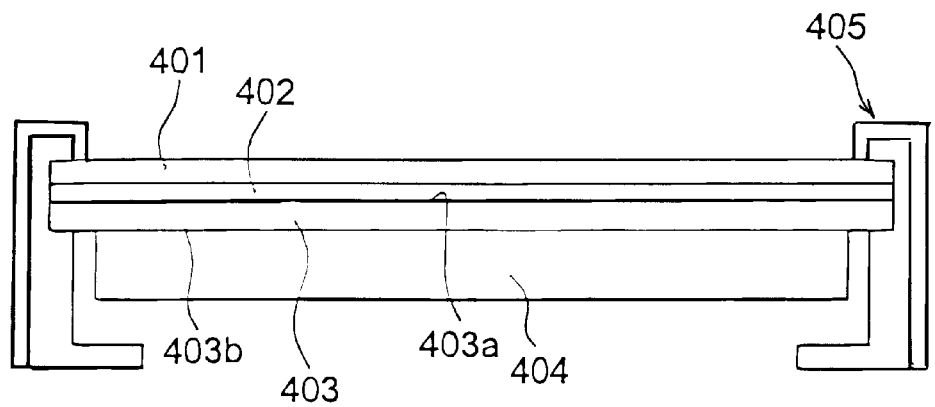
FIG. 12 is a partially enlarged sectional view of a thin-film solar cell module in accordance with Example 2 of the present invention.

FIG. 12 is a schematic view illustrating the construction of a thin-film solar cell module in accordance with another embodiment of the present invention.

In the thin-film solar cell module of FIG. 12, the rear-face sealing resin film 403 is black on its light-receiving face (front face) 403a and white on its non-light-receiving face (rear face) 403b. Other construction is the same as that of FIG. 11.

Figure 13:
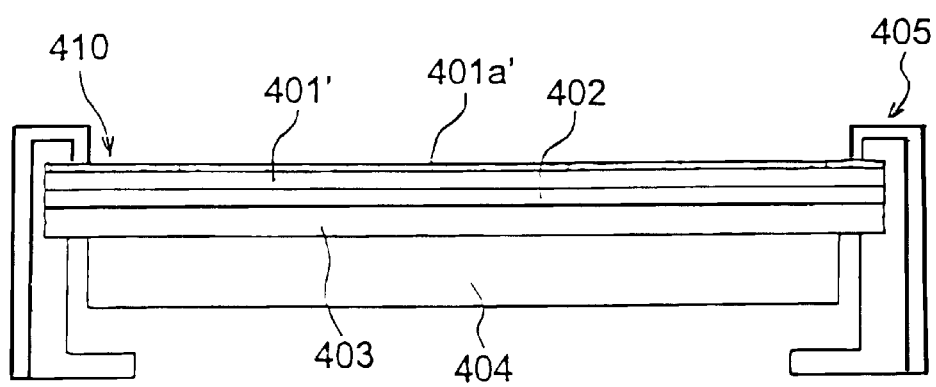
FIG. 13 is a partially enlarged sectional view of a thin-film solar cell module in accordance with Example 3 of the present invention.

FIG. 13 is a schematic view illustrating the construction of a thin-film solar cell module in accordance with another embodiment of the present invention.

In the thin-film solar cell module of FIG. 13, a light-transmissive substrate 401' of a blue glass plate with a transparent electroconductive film 401a' of tin oxide deposited on the surface thereof by thermal CVD is used as a light-transmissive substrate of the solar cell element 410. Other construction is the same as that of FIG. 12. The light-transmissive substrate 401' used in this embodiment has a characteristic shown by a curved line B in FIG. 14.

EXAMPLE 1

As shown in FIG. 11, an amorphous silicon semiconductor layer 402 was formed on a light-transmissive substrate 401 to form a solar cell element 410. A rear-face sealing resin film 403 whose both faces are white and a thermal insulation layer 404 were bonded to a non-light-receiving face of the solar cell element 410 to form a solar cell panel 411. The solar cell panel 411 was fitted in and bonded to an aluminum frame 405 with butyl rubber. Thus a thin-film solar cell module was produced. The light-receiving face 405a of the frame 405 was black and its non-light-receiving face 405b was silver (color of aluminum). As the light-transmissive substrate 401, a blue glass plate was used having a characteristic indicated by a curved line A in FIG. 14.

This thin-film solar cell module was installed outdoors and changes in its temperature and photovoltaic conversion efficiency were observed. The temperature of the prior-art module was only about 40 degrees higher at the maximum even at the center of the module and only about 25 degrees at the periphery of the module near the frame than the ambient temperature in summer. However, in the thin-film solar cell module of this Example 1, the temperature of the entire module was about 45 to 55 degrees higher than the ambient temperature and reached about 75 to 85° C. in summer. Also, the prior-art module exhibited a photo degradation of about 24% on the annual average, but the thin-film solar cell module of Example 1 exhibited a photo degradation of about 20% on the annual average. Thus great improvement was confirmed with Example 1.

EXAMPLE 2

As shown in FIG. 12, a thin-film solar cell module was produced in the same manner as in Example 1 except that the light-receiving face 403a (front face) of the rear-face sealing resin film 403 was black and its non-light-receiving face 403b (rear face) was white.

This thin-film solar cell module was installed outdoors and changes in its temperature and photovoltaic conversion efficiency were observed. The temperature of the prior-art module was only about 40 degrees higher at the maximum even at the center of the module and only about 25 degrees at the periphery of the module near the frame than the ambient temperature in summer. However, in the thin-film solar cell module of Example 2, the temperature of the entire module was about 48 to 58 degrees higher than the ambient temperature and reached about 78 to 88° C. in summer. Also, the prior-art module exhibited a photo degradation of about 24% on the annual average, but the thin-film solar cell module of Example 2 exhibited a photo degradation of about 19% on the annual average. Thus great improvement was confirmed with Example 2.

EXAMPLE 3

As shown in FIG. 13, a thin-film solar cell module was produced in the same manner as in Example 2, except that a blue glass plate with a transparent electroconductive film 401a' of tin oxide deposited on its surface by thermal CVD was used as a light-transmissive substrate of the solar cell element. The light-transmissive substrate has the characteristic indicated by the curved line B in FIG. 14.

This thin-film solar cell module was installed outdoors and changes in its temperature and photovoltaic conversion efficiency were observed. The temperature of the prior-art module was only about 40 degrees higher at the maximum even at the center of the module and only about 25 degrees at the periphery of the module near the frame than the ambient temperature in summer. However, in the thin-film solar cell module of Example 3, the temperature of the entire module was about 53 to 63 degrees higher than the ambient temperature and reached about 83 to 93° C. in summer. Also, the prior-art module exhibited a photo degradation of about 24% on the annual average, but the thin-film solar cell module of Example 3 exhibited a photo degradation of about 17% on the annual average. Thus great improvement was confirmed with Example 3.

What is claimed is:

1. A thin-film solar cell module including a light transmission portion(s) occupying from about 1% to 50% of a power generating area of the solar cell module, the solar cell module comprising:

a light-transmissive substrate;

a front electrode layer;

a photovoltaic conversion layer;

a rear electrode layer, and wherein the front electrode layer, the photovoltaic conversion layer and the rear electrode layer are sequentially laminated on the light-transmissive substrate;

a heat retention member comprising a sealing layer and covering the rear electrode layer; and the sealing layer for sealing the rear electrode layer, wherein the heat retention member has a light absorptance of 40% or more within a near-infrared wavelength range of 1,500 to 2,000 nm.

2. A thin-film solar cell module according to claim 1, wherein the sealing layer is formed of a blue glass plate having a light transmissivity of 70% or more within a visible light range of 400 to 800 nm.

3. A thin-film solar cell module according to claim 1, wherein the sealing layer is formed of a glass plate having a zinc oxide film or a laminate film of a zinc oxide film and a silver film on a surface of the glass plate and has a light transmissivity of 70% or more within a visible light range of 400 to 800 nm.

4. A thin-film solar cell module according to claim 1, wherein the light-transmissive substrate has a light absorptance of 40% or more within a near-infrared wavelength range of 1,500 to 2,000 nm.

5. A thin-film solar cell module according to claim 1, wherein the light-transmissive substrate is formed of a blue glass plate which is provided with a transparent electroconductive film and has a light transmissivity of 70% or more within a wavelength range of 400 to 800 nm.

6. A thin-film solar cell module according to claim 1 further comprising a frame for supporting the module provided in a periphery of the module, wherein the frame has a light-receiving face and a non-light-receiving face and has a higher thermal emissivity on the light-receiving face than on the non-light-receiving face.

7. A thin-film solar cell module according to claim 6, wherein the light-receiving face of the frame is black or of a darker color than the non-light-receiving face of the frame which is silver or white.

8. A thin-film solar cell module according to claim 6, wherein the light-receiving face of the frame is black and the non-light-receiving face of the frame has a thermal insulator.

9. A thin-film solar cell module according to claim 1 further comprising a light-transmissive portion running through the photovoltaic conversion layer and the rear electrode layer, wherein the heat retention member is light-transmissive.

10. A thin-film solar cell module according to claim 1, wherein the photovoltaic conversion layer comprises amorphous silicon.

11. A thin-film solar cell module comprising:
a light-transmissive substrate;
a front electrode layer;
a photovoltaic conversion layer;
a rear electrode layer, and wherein the front electrode layer, the photovoltaic conversion layer and the rear electrode layer are sequentially laminated on the light-transmissive substrate; and
a heat retention member covering the rear electrode layer, wherein the heat retention member is formed of glass containing 1 to 50% by volume of gas therein.

12. A thin-film solar cell module comprising:
a light-transmissive substrate;
a front electrode layer;
a photovoltaic conversion layer;
a rear electrode layer, and wherein the front electrode layer, the photovoltaic conversion layer and the rear electrode layer are sequentially laminated on the light-transmissive substrate; and
a heat retention member covering the rear electrode layer, wherein the heat retention member comprises a sealing layer and a thermal insulation layer formed on the sealing layer, and the thermal insulation layer includes a sheet comprising silica aerogel, and the sealing layer has a light absorptance of 40% or more within a near-infrared wavelength range of 1,500 to 2,000 nm.

13. A thin-film solar cell module comprising:
a light-transmissive substrate;
a front electrode layer;
a photovoltaic conversion layer;
a rear electrode layer, and wherein the front electrode layer, the photovoltaic conversion layer and the rear electrode layer are sequentially laminated on the light-transmissive substrate;
a heat retention member covering the rear electrode layer, and
wherein the heat retention member comprises a vacuum thermal insulator comprising a core member and a resin film wrapping the core member and has an inner pressure of 1 torr or lower.

14. A thin-film solar cell module according to claim 13, further comprising a sealing layer between the rear electrode layer and the vacuum thermal insulator, wherein the sealing layer is formed by vacuum-sealing a resin film to the rear electrode layer and the vacuum thermal insulator is vacuum-sealed to the rear electrode layer with use of the resin film simultaneously with the sealing layer.

15. A thin-film solar cell module according to claim 14, wherein the resin film is a film of a polyethylene terephthalate resin with aluminum deposited thereon and is in the form of a bag.

16. A thin-film solar cell module according to claim 14, wherein the resin film is bonded to the non-light-receiving face of the module with a transparent resin.

17. A thin-film solar cell module according to claim 13, wherein the vacuum thermal insulator contains a chemical adsorbent which has a large adsorptivity to cyclopentane and carbon dioxide gas at 25 to 70° C.

18. A thin-film solar cell module according to claim 13, wherein the light-transmissive substrate comprises multi-layered glass.

19. A thin-film solar cell module comprising:
a light-transmissive substrate on a light-receiving face of the module;
a front electrode layer;
a photovoltaic conversion layer;
a rear electrode layer, and wherein the front electrode layer, the photovoltaic conversion layer and the rear electrode layer are sequentially laminated on a face opposite to a light-receiving face of the light-transmissive substrate; and
a heat retention member covering the rear electrode layer, wherein the heat retention member comprises a resin film, and the resin film has a light-receiving face and a non-light-receiving face and has a higher thermal emissivity on the light-receiving face than on the non-light-receiving face.

20. A thin-film solar cell module according to claim 19, wherein the light-receiving face of the resin film is black or of a darker color than the non-light-receiving face of the resin film which is silver or white.

21. A thin-film solar cell module according to claim 19, wherein the resin film is a laminate film of a black resin film, a silver or white resin film and an aluminum film sandwiched between the black resin film and the silver or white resin film.

22. A thin-film solar cell module comprising:
a light-transmissive substrate;
a front electrode layer;
a photovoltaic conversion layer;
a rear electrode layer, and wherein the front electrode layer, the photovoltaic conversion layer and the rear electrode layer are sequentially laminated on the light-transmissive substrate; and
a heat retention member covering the rear electrode layer, wherein the heat retention member comprises a frame for supporting the substrate, the front electrode layer, the photovoltaic conversion layer and the rear electrode layer, and the frame has a light-receiving face and a non-light-receiving face and has a higher thermal emissivity on the light-receiving face than on the non-light-receiving face.

23. A thin-film solar cell module according to claim 22, wherein the light-receiving face of the frame is black or of a darker color than the non-light-receiving face of the frame which is silver or white.

24. A thin-film solar cell module according to claim 22, wherein the light-receiving face of the frame is black.

25. A thin-film solar cell module comprising:
a light-transmissive substrate;
a transparent front electrode layer;
a photovoltaic conversion layer;
a rear electrode layer, and wherein the front electrode layer, the photovoltaic conversion layer and the rear electrode layer are sequentially laminated and are supported by the light-transmissive substrate to form a solar cell;
a light-transmissive portion running from the front electrode layer through the photovoltaic conversion layer and the rear electrode layer; and
a light-transmissive sealing layer covering the rear electrode layer,
wherein the sealing layer has a light absorptance of 40% or more within a near-infrared wavelength range of 1,500 to 2,000 nm.

26. A thin-film solar cell module according to claim 25, wherein the sealing layer is formed of a blue glass plate having a light transmissivity of 70% or more within a visible light range of 400 to 800 nm.

27. A thin-film solar cell module according to claim 25, wherein the sealing layer is formed of a glass plate having a zinc oxide film or a laminate film of a zinc oxide film and a silver film on a surface of the glass plate and has a light transmissivity of 70% or more within a visible light range of 400 to 800 nm.

28. A thin-film solar cell module comprising:

a light-transmissive substrate;

a transparent front electrode layer;

a photovoltaic conversion layer;

a rear electrode layer, and wherein the front electrode layer, the photovoltaic conversion layer and the rear electrode layer are sequentially laminated and are supported by the light-transmissive substrate to form a solar cell;

a light-transmissive portion running from the front electrode layer through the photovoltaic conversion layer and the rear electrode layer; and a light-transmissive sealing layer covering the rear electrode layer, wherein the sealing layer comprises glass containing 1 to 50% by volume of gas therein.

29. A thin-film solar cell module comprising:

a light-transmissive substrate;

a transparent front electrode layer;

a photovoltaic conversion layer;

a rear electrode layer, and wherein the front electrode layer, the photovoltaic conversion layer and the rear electrode layer are sequentially laminated and are supported by the light-transmissive substrate to form a solar cell;

a light-transmissive portion running from the front electrode layer through the photovoltaic conversion layer and the rear electrode layer;

a light-transmissive sealing layer covering the rear electrode layer, wherein the light-transmissive sealing layer has a light absorptance of 40% or more within a near-infrared wavelength range of 1,500 to 2,000 nm; and a light-transmissive thermal insulator covering the light-transmissive substrate or the sealing layer.

30. A thin-film solar cell module according to claim 29, wherein the thermal insulator comprises a sheet including silica aerogel.

31. A thin-film solar cell module according to claim 29, wherein the light-transmissive substrate has a light absorptance of 40% or more within a near- infrared wavelength range of 1,500 to 2,000 nm.

32. A thin-film solar cell module according to claim 29, wherein the light-transmissive substrate is formed of a blue glass plate which is provided with a transparent electroconductive film and has a light transmissivity of 70% or more within a wavelength range of 400 to 800 nm.

33. A thin-film solar cell module according to claim 29, further comprising a frame for surrounding a periphery of the module, wherein the frame has a higher thermal emissivity on a substrate side of the frame than on a sealing layer side of the frame.

34. A thin-film solar cell module according to claim 29, wherein a substrate side of the frame is black or of a darker color than a sealing layer side of the frame which is silver or white.

35. A thin-film solar cell module according to claim 29, wherein a substrate side of the frame is black and the frame has a thermal insulator on a sealing layer side thereof.

36. A thin-film solar cell module comprising:

a solar cell element having a semiconductor layer comprising amorphous silicon, wherein a vacuum layer is formed on both light-receiving face and a non-light-receiving face of the solar cell element.

37. A thin-film solar cell module comprising:

a solar cell element having a semiconductor layer comprising amorphous silicon and a thermal insulation means on a non-light-receiving face of the solar cell element, and wherein a rear face of the solar cell element is sealed with a resin film, and the resin film has a higher thermal emissivity on a light-receiving face of the resin film than on a non-light-receiving face of the resin film.

38. A thin-film solar cell module comprising:

a solar cell element including a semiconductor layer comprising amorphous silicon and a thermal insulation means on a non-light-receiving face of the solar cell element, and wherein a frame is attached to the module, and the frame has a higher thermal emissivity on a light-receiving face of the frame than on a non-light-receiving face of the frame.

* * * * *